United States Patent [19]

Nusser et al.

[11] Patent Number: 4,839,812
[45] Date of Patent: Jun. 13, 1989

[54] METHOD AND SYSTEM FOR TESTING INTERNAL COMBUSTION ENGINE COMPUTERIZED CONTROL UNITS

[75] Inventors: Claus-Dieter Nusser, Schwieberdingen; Johannes Locher, Stuttgart, both of Fed. Rep. of Germany

[73] Assignee: Robert Bosch GmbH, Stuttgart, Fed. Rep. of Germany

[21] Appl. No.: 97,534

[22] Filed: Sep. 16, 1987

[30] Foreign Application Priority Data

Sep. 25, 1986 [DE] Fed. Rep. of Germany ....... 3632569

[51] Int. Cl.$^4$ ...................... G06F 15/20; G05B 15/02
[52] U.S. Cl. ................................ 364/424.04; 364/151; 364/442
[58] Field of Search ........................ 364/424, 151, 442

[56] References Cited

U.S. PATENT DOCUMENTS 4,234,921 11/1980 Kinoshita ............................ 364/464
4,267,569 5/1981 Baumann et al. .

Primary Examiner—Eugene R. LaRoche
Assistant Examiner—David Soltz
Attorney, Agent, or Firm—Frishauf, Holtz, Goodman & Woodward

[57] ABSTRACT

A control unit installed in a vehicle, particularly a control unit to control an internal combustion engine (ICE) thereof, has within its already present computation stage, a program store or program memory (PS, 2b') which stores a test program (TP) therein. The program store (PS) also includes an operating program memory (OP) used to control operation of the vehicle and/or the ICE thereof. The test apparatus includes a test computer and comparator (1) and a simulation and measuring unit which applies simulated input signals to the vehicular control unit, for example sequentially and only to single inputs thereof. The test program within the vehicular control unit is then run under control of the test computer and forwards the data referring to the applied signals via the serial interface 5 to the test computer 1 for evaluation. The test computer can also control the test program, resulting in output signals which are measured in the simulation and control unit (6) and applied as measured results to the test computer and comparator for evaluation and checking against desired or standard values. The normal operating program, likewise, can be read out for checking. The simulation and control unit may, for example, include a resistance network which is sequentially, selectively connected to the vehicular control unit under control of the computer and comparator (1) to provide appropriate input signals to selected input terminals.

22 Claims, 1 Drawing Sheet

METHOD AND SYSTEM FOR TESTING INTERNAL COMBUSTION ENGINE COMPUTERIZED CONTROL UNITS

The present invention relates to a method and a system to test electronic computerized control units, and more particularly to non-invasive testing of essentially sealed control units for use with internal combustion engines (ICE's), and especially automotive ICE's.

BACKGROUND

Control units which control the operation of internal combustion engines frequently are sealed to prevent ingress of moisture, humidity, salt spray and the like, which might interfere with proper operation of the control units. In operation, the control units receive input signals from sensors located at various operating elements of the internal combustion engine (ICE), for example signals representative of speed, loading on the engine, ambient temperature, engine temperature and the like. To test such units, it has been customary to apply to the control units signals which are the same as those derived from the sensors. For example, speed sensors, acceleration pedal sensors, temperature sensors and the like, are connected to the inputs of the control unit; the outputs of the control units are then coupled to the respective positioning elements which, in turn, actually position the respective operating elements of the ICE. Thus, the unit is tested to operate as if the vehicle were actually operating and moving. Test stands of this type are expensive, space-consuming, and have the disadvantage that testing of the electronic control unit is time-consuming due to the connection time required for the respective input and output elements and the calibration time therefor. Additionally, it has been found that the respective test methods and apparatus provide, similar to actual operation of the engine, simultaneously effective data from the inputs as well as the outputs. The control unit may jointly process at least some of those data. It may thus occur that a malfunction which is due to a connection or internal element of the control unit and which is peculiar to a single input or a single output is masked by influences derived from other inputs or applied to other outputs, or at least highly attenuated. Malfunction at specific input or output ports of the control unit thus is difficult to diagnose, since desired specific characteristics are difficult to obtain. Additionally, it is frequently necessary to invade the internal components or connections of the control unit. The control unit, however, preferably, should remain sealed and in its original condition. Opening the control unit for making connections, and then resealing the control unit, may cause additional defects due, for example, to improper or ineffective resealing, or unintended destruction of components or connections.

The Invention

It is an object to provide a method and system for non-invasive testing of vehicular control units and especially for internal combustion engines (ICEs), for example of the automotive type, which is rapid, provides unambiguous results at respective input and output terminals or ports, and which can be carried out with a minimum of equipment in a minimum amount of time.

Briefly, the control unit, especially for use with an ICE, hereinafter for short "vehicular control unit" (VCU), has, within its already present computation stage, a program store or program memory which stores a test program therein. The program store, of course, also includes an operating program memory, which is used in operating the ICE. The test apparatus includes a test computer and a simulation and measuring unit. The simulation and measuring unit applies simulated input signals which, after energizing the test program memory of the memory store, cause the vehicular control unit to operate in accordance with the test program stored therein or, selectively, in accordance with its operating program. The simulation and measuring unit provides simulated input signals to the VCU. The test program controlled computation stage gets input values via the input circuits of the VCU and these values will be forwarded under control of the test program via a serial interface into the test computer for evaluation, compared with nominal values, for example. The simulation and measuring unit also provides signals to the VCU which cause a specific reaction of the VCU which will be measured by the measuring stage and evaluated in the test computer. The test computer can control the test program via the serial interface in order to stimulate outputs of the VCU. These outputs are measured. If the measured values do not confirm to the desired output values, a malfunction indication can be triggered. An external test computer, which is part of the test stand external to the vehicular computer, evaluates the measured results. Any malfunction can thus be diagnosed rapidly and unambiguously.

In accordance with a feature of the invention, the required test program to carry out the test itself is contained within the program store of the computation unit, typically a microprocessor unit. It is controlled by a serial interface, which is part of the test stand or test computer, so that the test steps or sequences can be carried out without opening the vehicular computer unit at all, and so that the test can be carried out non-invasively. This is of substantial advantage since vehicular control units can thus be tested without, in any way, interfering with their state or condition under which they are being tested and in which they will, later on, be used if no malfunction is apparent.

The system, in accordance with a feature of the invention, includes a controllable simulation and measuring stage which is connected to respective inputs and/or outputs of the vehicular control unit. The simulation stage of the controllable simulation and measuring unit may, for example, take the form of a resistance decade or resistance matrix or series resistance circuit which, by changing the resistance values, can provide respectively different output voltages at various output current values which are applied to the vehicular control unit via controllable relays to the respective inputs of the vehicular control unit. The relays, of course, can be semiconductor units. Thus, individual inputs and/or outputs can be separately tested without connections to other inputs or outputs influencing individual testing steps. If desired, of course, multiple inputs and outputs can also be energized, and outputs tested to determine if, for example, there should be internal undesired crossovers or whether the interaction of inputs from various outputs operates properly.

The input and output circuits of the control unit and/or the test unit may, essentially, include analog/digital (A/D) or digital/analog (D/A) converters with driver stages. Connection of the input values are converted in the vehicular control unit by appropriate electrical circuits, into signals which can be processed by the microprocessor of the vehicular control unit. These values are transferred to the test computer over a serial interface, for evaluation therein, for example comparison with stored desired values. Further, the test program can arrange that output circuits are energized by the vehicular computer units with various values which are commanded by a command program derived from the test computer. The appropriate output values, which should be obtained from the vehicular computer, can then be checked by the measuring stage of the simulation and testing unit and/or by the test computer itself.

The programming memory of the vehicular computer can easily be checked by the method and system by providing a random address of the program memory which causes the vehicular computer to transmit the data stored under this address, the identification code of the memory content of the operating program for example, which is stored in a certain location of the program store, to test the computer. The test computer then can compare whether this stored program is correct and, for example, matches the program which the particular model of computer equipment should have. This arrangement has the additional advantage that program which are proprietary and contained within specific computer apparatus are tested only by similarly proprietary programs retained in the test computer and therefore which are not accessible to unauthorized read-out.

DRAWINGS

FIG. 1 is a highly schematic diagram of a testing arrangement to test electrical circuits, and particularly the input and output circuits of a vehicular computer, and used in connection with the explanation of the method of the present invention, and FIG. 2 is a basic program structure of a programming store or memory and of the program within the vehicular control unit.

DETAILED DESCRIPTION

Figure 1:
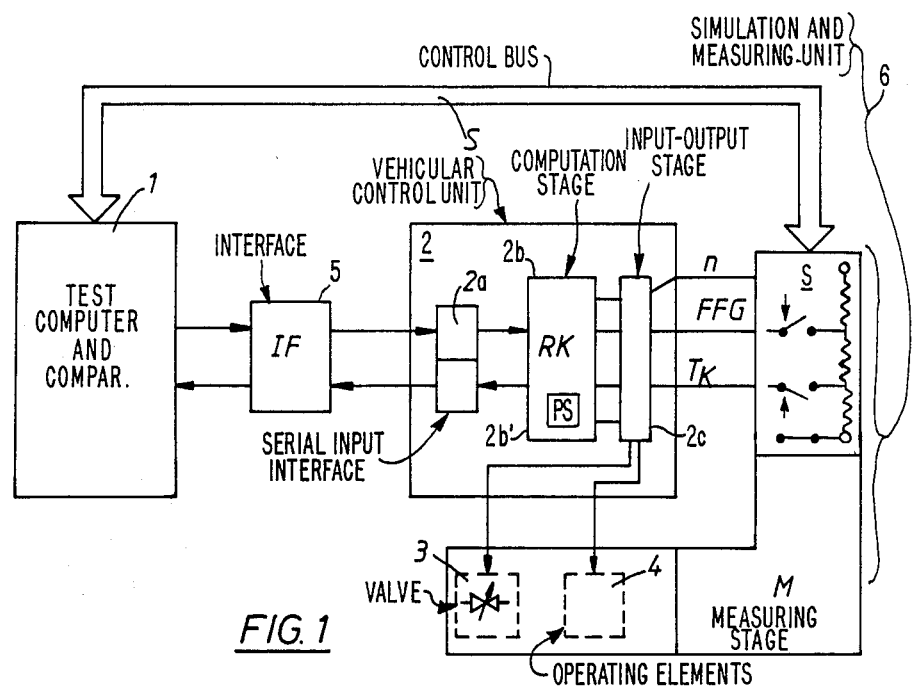

The test system illustrated in FIG. 1 has two interactive groups of components. A first group of components is a test group which includes an external test computer unit 1 which has therein a comparator section 1a. Computer apparatus or units customarily include circuitry and/or software to effect comparisons. The first group further includes an interface (IF) 5 and a simulation and measuring unit 6. The simulation and measuring unit has a voltage or value simulation section or stage S and a measuring stage M. The second group of the system includes a control unit 2 which is part of the vehicular control unit (VCU), controlling operation of an internal combustion engine (ICE), for example an automotive ICE. The VCU 2 is installed in the vehicle and is the element to be tested.

The interface 5 is provided for signal matching, that is, wave-shaping and matching of signals passing between the vehicular control unit 2 and the test computer and comparator 1.

The vehicular control unit 2 has a serial interface 2a, a computation stage 2b, which includes a program store or memory 2b', and an input-output stage 2c. The input-/output (I/O) stage 2c may, essentially, include merely analog/digital (A/D) converters and/or digital/analog (D/A) converters. The stage 2c can couple signals representative of vehicle operating conditions or parameters to the computation stage 2b. Such signals are, for example, signals representative of engine speed n, vehicle loading FFG, temperature $T_K$, or other signals. These signals are usually provided in analog form and are converted in the A/D converters in the input-output stage 2c to appropriate digital signals for digital processing in the computation stage 2b. Likewise, output circuits, for example controlling valve 3, or other output elements, shown collectively schematically by block 4, require analog signals and/or amplified signals; the D/A converters within the input-output stage 2c convert output signals from the computation stage 2b to the appropriate analog signals for operation of the respective operating elements 3, 4.

Figure 2:
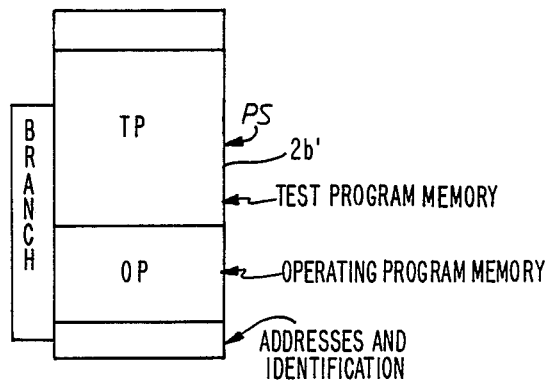

In accordance with a feature of the present invention, the program store PS includes, besides the operating program for operating the various operating elements of an ICE, (based on inputs received from sensors in the ICE), an additional test program memory section TP (FIG. 2) which stores a test program. Thus, the program store PS, shown schematically in FIG. 2, includes the test program memory section TP, in addition to the already present normal operating program memory OP. In addition, the program store 2b' includes an identification section, to store the program memory identification code which identifies the operating program. The program store further includes a branching control which activates test program TP or operating program OP, depending on branch conditions.

In accordance with a further feature of the invention, the simulation and measuring section 6 can be connected to the respective inputs n, FFG, $T_K$, and such other inputs as may be provided, of the input-output stage 2c for processing of signals by the computation stage 2b. A bi-directional control bus B connects the test computer 1 with the simulation stage unit 6 for control of application of signals from the simulation and measuring unit 6 to the control unit 2, and for overall operating control of the system. The control bus B, thus, under control of the test computer 1, can command the unit 6 to provide outputs at respective output terminals of different resistance or voltage values which, selectively, can be applied to any one of the inputs to the input-output stage 2c of the control unit 2. The unit 6, in its simulation section or stages, includes for example a resistance network with controlled switches, such as relays therein, to connect, selectively, voltage values, resistances and other electrical parameters to the respective inputs. A controlled testing decade or testing matrix may also be included within the simulation stage S. A few controlled switches and one resistance network, connected, for example, between a source of controlled voltage, are shown merely for purposes of illustration within the block S of FIG. 1. under control of the test computer and comparator unit 1, for example upon operating a "start" button thereof.

The method and arrangement of the present invention also readily permits testing the contents of the program retained within the operating program memory OP. This test can be carried out to determine if the content is appropriate for the model under test and does not have any gaps. To check the operating program memory OP, the test program TP is addressed via the interface 5 from the test computer by a suitable command signal and comparator 1, for retransmission of the program contents or the content of any other randomly addressed location within the program store 2b', the identification code IC, for example, into the test computer and comparator. The test computer and comaprator 1 then compares the reproduced read-out program or data with data stored in the test computer and comparator. The system is a closed one, so that unauthorized access to the program stored within the operating program memory OP is effectively inhibited.

During testing, various program steps are sequentially carried out in accordance with the test program stored in the test program memory TP, transmitted for example via the measuring stage and/or the interfaces 2a and 5 to the test computer and comparator 1, for evaluation therein, for example for comparison with stored values within the memory of the test computer. The test can be carried out without in any way interfering with the integrity of the vehicular control unit 2, that is, without opening it. The vehicular control unit is an integral, sealed structure which has, as is usual, externally accessible connectors or terminals, shown at 11, 12, coupled to interface 2a; connectors 13–17 coupled to the I/O stage 2c; and connectors 18, 19 coupling the I/O stage to the operating elements 3, 4. Thus, the vehicular control unit 2 can be electrically accessed, yet need not be invaded, but can be retained in its physically sealed condition. It is only necessary to connect the simulation and measuring unit 6 to the appropriate input and output terminals of the input-output stage 2c and to connect the interface 5 to appropriate terminals 11, 12, already present on the vehicular control unit 2, which terminals provide the output signals in accordance with the then proceeding test under control of the test program stored in the test program memory TP or, if the operating program is to be read out, the data stored in the operating program memory. Such input-output terminals are inherently provided by the serial input-output interface 2a of the vehicular control unit 2.

A suitable test computer and comparator 1 can be constructed by using standard chips or purchasable standard computers. A suitable interface 5 is a standard interface for example a V24 or RS 232 Interface.

A vehicular control unit which can be tested in this manner, and which has memory capacity to include besides the operating memory, the identification code, the test program and branching instructions as described.

The simulation stage S may, for example, include resistance units, and/or resistive, inductive and capacitive load units, and simulations of any in a vehicle occuring sensors and actuators. The measuring stage M includes standard measuring devices, for example, voltmeter, ampere meter, counter and so on.

The testing method and system is useful not only for testing control units and their programs directed strictly to the operation of an ICE; it may be used, also, to test additional control units including their programs such as control units to control other vehicular systems, such as antilock braking systems ventilation systems and the like.

We claim:

1. Non-invasive method of testing an electrical computerized vehicular control unit (2) for proper operation, utilizing a testing system, said vehicular control unit (2) comprising a physically sealed integral structure having within said structure a computation stage (2b) including a program store (PS, 2b') and externally accessible input/output and diagnostic terminals (11–19) adapted to be connected, selectively, with respective input terminals of a vehicle,
comprising the steps of storing, in the program store (PS, 2b') of the computation stage (2b) of the vehicular control unit (2) a test program (TP) including a sequence of test steps;

providing a test group external of and separate from the vehicular control unit, and forming part of said system, said test group including a test computer (1) having a comparator section, and a simulation and measuring unit (6);

connecting, to said sealed integral structure of the vehicular control unit, through selected input/output terminals and the diagnostic terminals, signals from the test group;

addressing, through selected ones of said terminals, the program store (2b') to initate the test program in the vehicular control unit (2);

said signal connecting step including applying, from the test group, to selected input terminals (13, 14, 15) of the control unit (2) simulated electrical values representative of actual values applied thereto by elements of the vehicle, while leaving non-selected input and output terminals uncontrolled; and sequentially, under control of the test program in the vehicular control unit (2), evaluating the signals appearing at the selected terminals (13, 14, 15) of the control unit (2) and transmitting, via selected terminals (11, 12; 16, 17), signals representative of the evaluated signals to the test group for determination if said evaluated signals are representative of proper operability of said vehicular control unit (2) or not.

2. The method of claim 1, wherein the step of applying simulated electrical values comprises sequentially energizing selected ones of said input or output terminals (13, 14, 15) under control of an external sequential program contained in the test computer (1).

3. The method of claim 1, wherein the step of testing signals comprises testing said signals within the control unit (2) under control of the test program (TP) stored in the program store (2b'), and further including the step of transmitting the results of said test to the external test computer (1), said external test computer comparing the results of said test with standard or desired results.

4. The method of claim 1, wherein the program store (2b), (PS) additionally stores an operating program (OP) for the vehicle;

further including the step of controlling said program store to read-out the operating program, and transmit said operating program to the test computer (1);

and further including the step of testing said read-out program in said external test computer to determine the accuracy thereof.

5. The method of claim 4, wherein the step of controlling the program store to read-out the operating program comprises transmitting a command signal from the test computer (1) to the vehicular control unit (2) for controlling the program store (2b') to read-out the operating program contained therein.

6. The method of claim 1, further including the step of controlling the program store to read-out randomly addressable contents of the program store, and transmitting said so addressed contents to the test computer (1);

and further including the step of testing said read-out contents in said test computer to determine the accuracy thereof.

7. The method of claim 1, wherein said control unit comprises a control unit of an automotive internal combustion engine;

and said steps of applying simulated electrical values to said vehicular control unit (2) comprises applying to said vehicular control unit signals representative of operating characteristics of the internal combustion engine.

8. The method of claim 7, wherein the step of initiating the test step includes applying to the computation stage (2b) on at least a terminal thereof an extreme value of an electrical parameter in excess of values representative of operating conditions of said vehicle to form a start and recognition signal.

9. The method of claim 1, wherein said step of testing said signals for proper operability comprises comparing said signals with desired or standard signals in the comparator section of the test computer (1).

10. The method of claim 9, wherein the step of initiating the test step includes applying to the computation stage (2b) on at least a terminal thereof an extreme value of an electrical parameter in excess of values representative of operating conditions of said vehicle to form a start and recognition signal.

11. The method of claim 1, wherein said step of applying simulated signals comprises applying simulated input signals to an input-output stage (2c) of the control unit (2), representative of input signals derived from operating elements of the vehicle;

wherein the step of evaluating said signals includes processing said signals, in accordance with at least one of: the test program (TP); the operating program (OP);

and wherein said testing step comprises transmitting output signals based on said processed input signals to an external test computer and comparator (1) for testing regarding appropriateness of the received output signals.

12. The method of claim 1, wherein the step of initiating the test step includes applying to the computation stage (2b) on at least a terminal thereof an extreme value of an electrical parameter in excess of values representative of operating conditions of said vehicle to form a start and recognition signal.

13. The method of claim 1, wherein the step of sequentially testing said signals comprises applying said signals from the vehicular control unit through an interface (5) to the external test computer (1), and said testing step comprises carrying out a comparison with standard or desired signals stored in said test computer (1).

14. The method of claim 1, wherein the step of evaluating said signals includes evaluating signals appearing at output terminals (16, 17, 18, 19) and comprises measuring the signals appearing at the output terminals of the vehicular control unit (2) and including the step of comparing the measured values with standard or desired values in the test computer.

15. Testing system for testing an electrical computerized vehicular control unit (2) for proper operation, said system including a test group (1, 1a, B, 6, S, M) and a vehicular control unit (2), wherein said test group includes a test computer (1) and a simulation and measuring unit (6), said test computer (1) being connected (B) to and controlling the simulation and measuring unit (6) for selective sequential transfer of signals to the vehicular control unit (2); and an interface unit (IF, 5) connecting the test computer (1) to the vehicular control unit (2);

said vehicular control unit comprising a physically sealed integral structure having within said structure a computation stage (2b) including a program store (PS, 2b') which stores
  (a) an operating program (OP) for controlling operation of elements of the vehicle, and
  (b) a test program for testing operation of the control unit, said vehicular control unit (2) having input terminals (13, 14, 15) for receiving input signals (n, FFG, $T_K$) representative of operating parameters of the vehicle, output terminals (16, 17, 18, 19) providing output signals for operating elements (3, 4) of the vehicle, and test input/output terminals (11, 12) for communicating signals between the vehicular control unit (2) and the interface (5) connected to the test computer (1), said stimultation and measuring unit (6) of the test group comprising a simulation stage (S) and a measuring stage (M), said simulation and measuring unit being connected to at least said input terminals (13-15) of the vehicular control unit and generating signals simulating, selectively, different operating conditions and parameters of the vehicle for evaluation of said simulating signals in the vehicular control unit, the vehicular control unit transferring signals representative of at least one of: data from the control unit (2); evaluated signals to at least one of: the test computer (1); the measuring stage (M); and wherein the test computer includes means for checking said transferred computed values against standard, desired values and providing an output representing agreement or disagreement between the transferred computed values and standard or desired values.

16. The system of claim 15, wherein the simulation and measuring unit (6) under control of the test computer (1) applies to said control unit (2) an electrical signal of an extreme value, in excess of values representative of operating conditions of said vehicle to form a start and recognition signal.

17. The system of claim 15, wherein said control unit comprises the control unit of an automotive internal combustion engine;

and wherein said input terminals are connected to receive, selectively, signals representing operating characteristics of the automotive internal combustion engine and simulated electrical values simulating the operating characteristics of the automotive internal combustion engine.

18. The system of claim 17, wherein the simulation and measuring unit (6) under control of the test computer (1) applies to said control unit (2) an electrical signal of an extreme value, in excess of values representative of operating conditions of said vehicle to form a start and recognition signal.

19. The system of claim 15, wherein the simulation and measuring unit (6) comprises a controlled testing decade or network and controlled switches, for selectively applying to selected inputs (n, FFG, $T_K$) signals to the control unit (2); and wherein said simulation and measuring unit further includes a measuring section or stage (M) connected to output terminals (16, 17) of said control unit (2) for measuring output signals derived from said control unit;

and a control bus (B) interconnecting the test computer (1) and the simulation and measuring unit (6) for selectively controlling application of said input signals and measuring of received output signals, and transmitting at least the measured values to said test computer and comparator.

20. The system of claim 19, wherein said test computer (1) activates the vehicular control unit (2) to start the test program for sequentially energizing outputs (16, 17) thereof for measuring the values of evaluated signals in the measuring stage (M) of said simulation and measuring unit.

21. The system of claim 15, wherein the test computer (1) activates the vehicular control unit (2) to carry out internal tests in accordance with the test program (TP) stored in said test program memory of the program store (PS) of the control unit (2) and transmit the test results via said interface (5) to the test computer and comparator for evaluation therein.

22. The system of claim 15, wherein the test computer (1) activates the control unit (2) to cause the test program (TP) stored in the test program memory of the program store (2b') to read-out the memory content of at least the operating program memory (OP) and to transmit said program to the test computer (1).

* * * * *